(12) United States Patent
Tsujino

(10) Patent No.: US 6,299,051 B1
(45) Date of Patent: Oct. 9, 2001

(54) BONDING METHOD OF ELECTRONIC PARTS EMPLOYING ULTRASONIC COUPLING OSCILLATION

(75) Inventor: Jiromaru Tsujino, Kanagawa (JP)

(73) Assignee: Asahi Rubber Products, Inc., Tokyo (JP)

( * ) Notice: Subject to any disclaimer, the term of this patent is extended or adjusted under 35 U.S.C. 154(b) by 0 days.

(21) Appl. No.: 09/533,078

(22) Filed: Mar. 22, 2000

(30) Foreign Application Priority Data

Mar. 26, 1999 (JP) .................................................. 11-083099

(51) Int. Cl.[7] .................................................. B23K 20/10
(52) U.S. Cl. .......................................... 228/110.1; 228/4.5
(58) Field of Search ............................... 228/110.1, 123.1, 228/180.21, 234.1, 1.1, 6.2, 180.5, 102, 103, 4.5

(56) References Cited

U.S. PATENT DOCUMENTS 5,699,950 * 12/1997 Jang .
5,816,476 * 10/1998 Buice et al. .
5,884,835 * 3/1999 Kajiwara et al. .
6,078,125 * 6/2000 Roberts .

* cited by examiner

Primary Examiner—Tom Dunn
Assistant Examiner—Jonathan Johnson
(74) Attorney, Agent, or Firm—Carter, Ledyard & Milburn

(57) ABSTRACT

An object of the present invention is to provide a sealing method by which an excellent bonding may be realized without thermal shock by bonding at a normal temperature due to ultrasonic coupling oscillation to seal a small size of surface mounting type quartz oscillator or the like. A bonding face (1a) of a sealing metal cap (1) is positioned on a bonded face (2a) of a package substrate (2), and ultrasonic oscillations of different directions are simultaneously imparted in the bonding plane while a suitable load is applied from an upper or a lower part of the bonding portion to the plane in a vertical direction so that the sealing metal cap (1) and the package substrate (2) are welded and fixed to be sealed on the bonding face.

7 Claims, 3 Drawing Sheets

BONDING METHOD OF ELECTRONIC PARTS EMPLOYING ULTRASONIC COUPLING OSCILLATION

BACKGROUND OF THE INVENTION

1. Field of the Invention

The present invention relates to a bonding method of electronic parts in which when a metal cap is fixed and sealed on a package substrate of an extremely small size of surface mounting type quartz oscillator or the like and an extremely small size of IC chip or the like is mounted on a substrate, a sealing condition or a mounting condition due to excellent bonding can be realized by utilizing ultrasonic coupling oscillation.

2. Description of the Prior Art

Presently, miniaturization and light weight manufacture for personal equipment such as mobile body communication apparatus such as a portable telephone, note type personal computers, digital VTR cameras or the like are remarkably progressed. In that trend, electronic parts integrated into such equipment is required to be a more miniaturized shape so as to fit into a high integrated packaging.

Specifically, as shown in a phenomenon in which with respect to main electronic parts such as quartz oscillators, generators, filters or the like, the volume of a package size became approximately one fifth during the past 2 to 3 years, a rapid high integration trend has progressed.

For example, with respect to a quartz oscillator, there is a process in which a quartz piece as an oscillator is placed and sealed in an atmosphere of inert gas in order to ensure a stable clock oscillation frequency. Conventionally, resin sealing, glass sealing, or electric resistance welded sealing or the like are generally executed. This way is similar to the cases of generators or filters.

For the aforementioned sealing process, mainly the electric resistance welded sealing is frequently used in a point of view of sealing airtightness and sealing strength. However, in a present situation in which package sizes have become smaller as described above, upon sealing of a package with a 3.0 mm square or smaller, if the electric resistance welded sealing is adopted, there is a problem in which a distance between electrodes for welding may not be taken enough physically and electronic parts may be thermally broken down while thermal shock is applied to the work by the heat generated at the time of welding or the like.

That is, in the sealing method by the conventional electric resistance welded sealing, roller electrodes with tapers are provided on a sealing cap, and pulsation welding is executed under a constant pressure condition so that bonding is executed by Joule heat generated in the bonding portion. Thus, there is a problem in which thermal shock is given on the package substrate and microcracks in the substrate may be generated. Further, when the sealing cap is small, the control of the heat generated becomes difficult, thereby causing problems in which the sealing cap is melted by the heat generated, and the manufacture of fine roller like electrodes is extremely difficult or the like. Thus, the method seems not to be appropriate for sealing of small-size electronic parts in these points of view.

With respect to mounting of electronic parts, it is a present condition that a conventional wire bonding method, or a flip chip method cannot keep up with. That is, the connecting pad size of a highly densely packaged semiconductor integrated circuit is approximately 100 $\mu$m square or smaller, and the distance between pads adjacent to each other is approximately 20 or shorter. Thus, when a conventional method is employed for bonding each IC pad, the bonding portions adjacent to each other are mutually superimposed and bonded, thereby causing an inconvenience in which an independent bonding portion is not ensured. This is a primary factor that prevents a miniaturization and a light weight manufacture of electronic parts.

In bonding electronic parts described above, although utilizing ultrasonic oscillation has been known in the past, since ultrasonic oscillation imparted at the time of bonding in the prior art is a single direction oscillation and further pre-heating that requires the biggest attention has to be given to this type of bonding, there are problems in which an excellent bonding cannot be obtained and the device may be broken due to an excessive pre-heating depending on the size, material or the like of the bonding object or the like.

SUMMARY OF THE INVENTION

A first aspect of the present invention is to provide a sealing method in which an excellent bonding can be realized without thermal shock by execution of bonding at a normal temperature by means of ultrasonic coupling oscillation to seal a surface mounting type quartz oscillator or the like of a particularly small type as described above.

Further, a second aspect of the present invention is to provide a mounting method in which an excellent mounting method can be realized in a technique of bonding to mount a semiconductor chip such as a flip chip on a substrate, employing the ultrasonic oscillation described above.

A first aspect of the bonding method of the present invention that is developed in order to solve the first object described above is characterized in that a bonding face of a sealing metal cap is positioned on a bonded face of a package substrate, and ultrasonic oscillations of different directions in the bonding plane are imparted at the same time while a suitable load is applied to the plane from an upper part or a lower part of the bonding portion in a vertical direction so that the sealing metal cap and the package substrate are welded and fixed to be sealed on the bonding face.

Further, a second aspect of the bonding method of the present invention that is developed in order to solve the second object described above is characterized in that a bonding portion that is for a substrate and is called a bump in a semiconductor chip such as a micro IC chip is placed downwards and is positioned on a predetermined position of the substrate that is placed upwards to bond the bump, and then while being pressed by a suitable load from the upper of the semiconductor chip, a plurality of bumps in the semiconductor chip are welded and fixed on a predetermined position by impartment of ultrasonic coupling oscillation of a component perpendicular to the direction of the load to the bumps of the semiconductor chip and between the electrodes of the substrate corresponding to the bumps.

DETAILED DESCRIPTION OF THE PREFERRED EMBODIMENT

Figure 1:
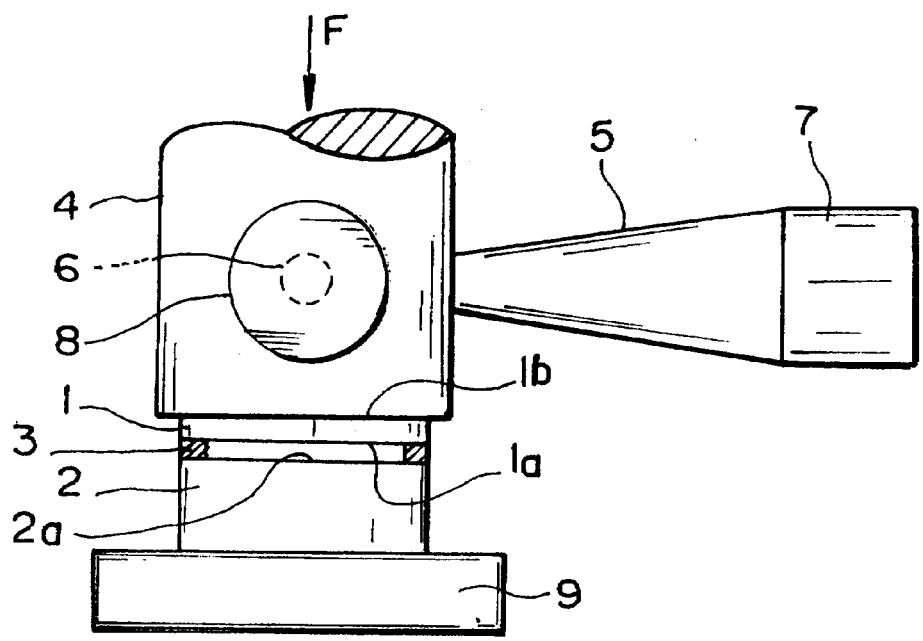
FIG. 1 is a schematic view showing a first embodiment of a bonding method according to a first aspect of the present invention.
Figure 2:
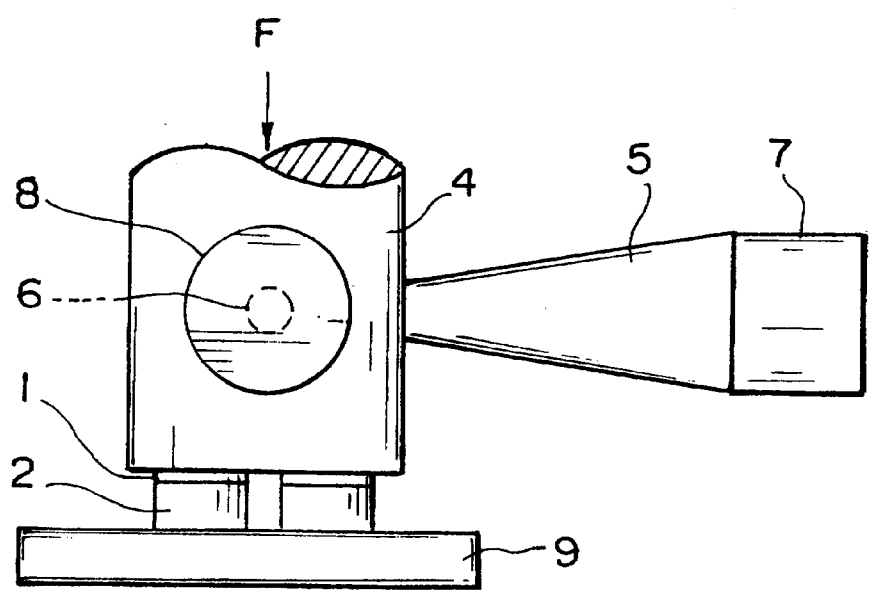
FIG. 2 is a schematic view showing a second embodiment of the bonding method according to the first aspect of the present invention.
Figure 3:
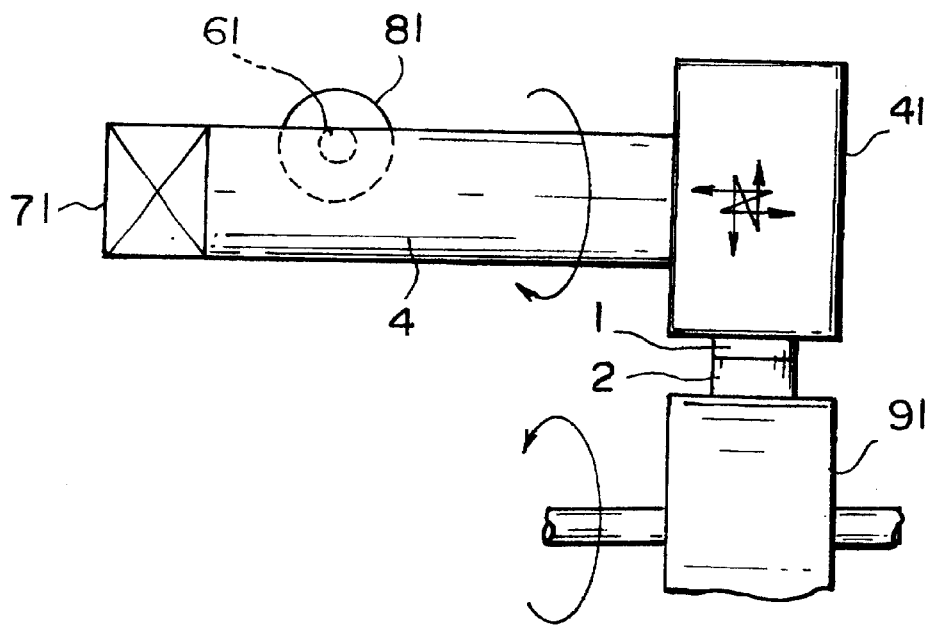
FIG. 3 is a schematic view showing a third embodiment of the bonding method according to the first aspect of the present invention.
Figure 4:
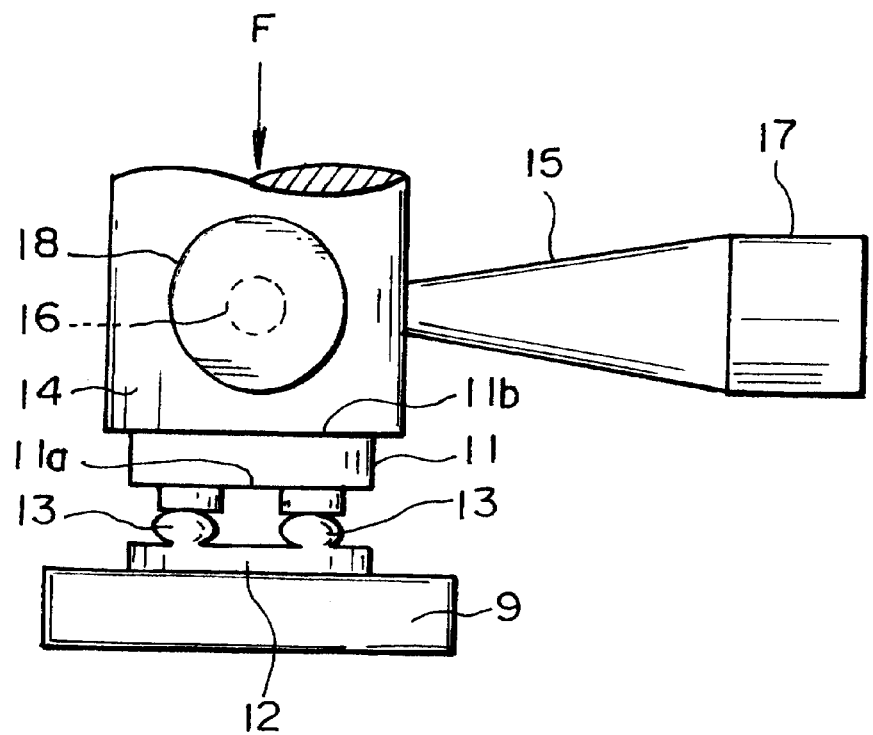
FIG. 4 is a schematic front view of a first embodiment of the bonding method according to a second aspect of the present invention.
Figure 5:
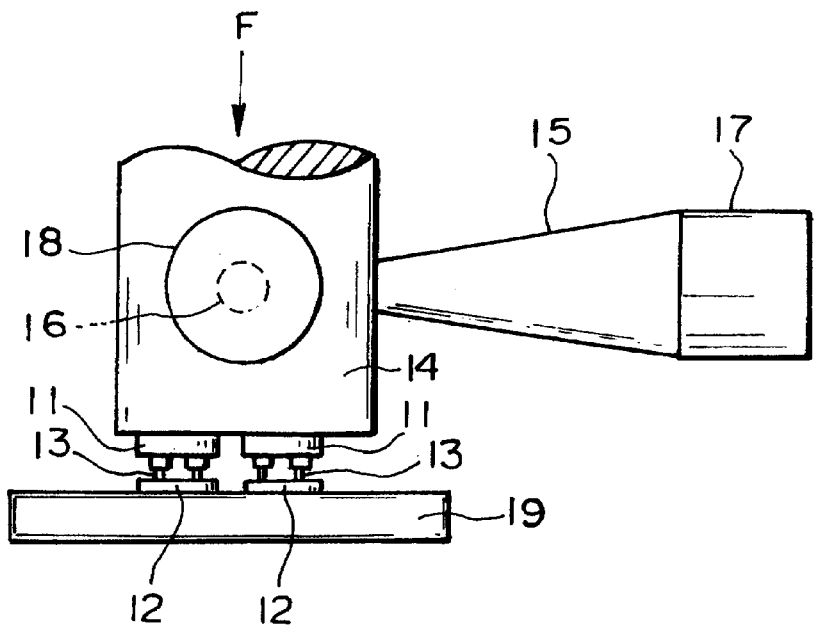
FIG. 5 is a schematic front view of a second embodiment of the bonding method according to the second aspect of the present invention.
Figure 6:
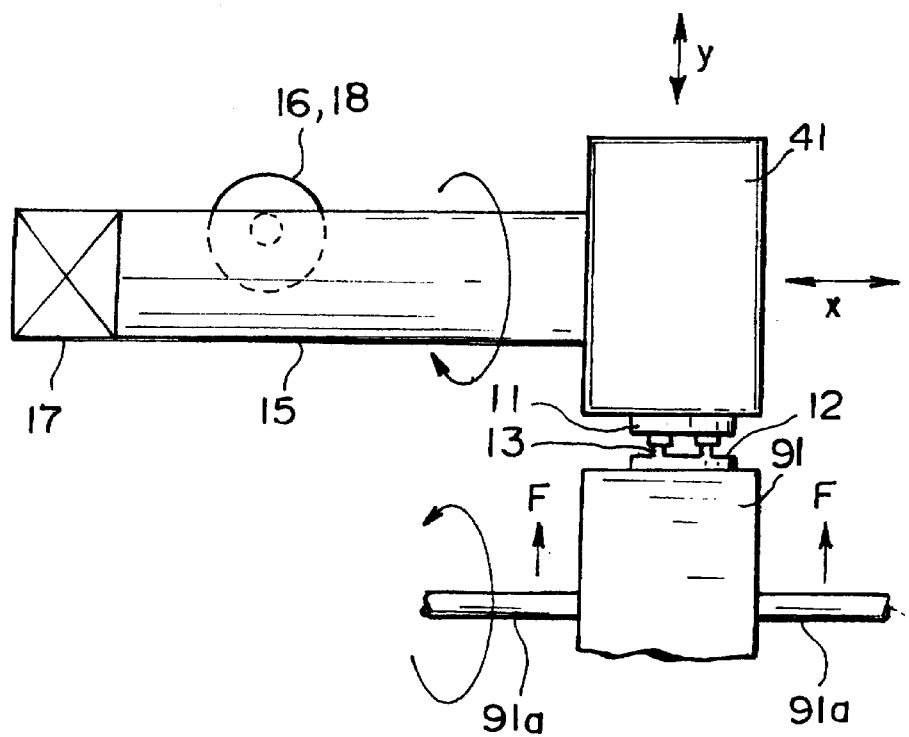
FIG. 6 is a schematic front view of a third embodiment of the bonding method according to the second aspect of the present invention.

Next, embodiments of the present invention will be described with reference to drawings. FIG. 1 is a schematic view showing a first embodiment of a bonding method according to a first aspect of the present invention, FIG. 2 is a schematic view showing a second embodiment of the bonding method according to the first aspect of the present invention, FIG. 3 is a schematic view showing a third embodiment of the bonding method according to the first aspect of the present invention, FIG. 4 is a schematic front view of a first embodiment of the bonding method according to a second aspect of the present invention, FIG. 5 is a schematic front view of a second embodiment according to the second aspect of the bonding method of the present invention, and FIG. 6 is a schematic front view of a third embodiment of the bonding method according to the second aspect of the present invention.

In FIG. 1, 1 denotes a metal sealing cap, 2 denotes a package substrate that is an object of positioning of the sealing cap 1 and of bonding, 3 denotes a sealing metal formed in advance on an upper face 2a of the package substrate 2 into a ring like shape on the side of a bonding face 1a of the cap 1, 4 denotes a rod like bonding head that is vertically disposed on an upper face 1b side of the sealing cap 1 in a vertical attitude, and 5, 6 denote oscillation transmitting hones that are in an orthogonal direction to the welding head 4 in a plane and are coupled with the bonding head 4, mutually forming place angles of 90 degrees. Piezoelectric transducers 7, 8, for example, of a Langevin type are coupled with these hones 5, 6, respectively. One example of the ultrasonic bonding device to execute the bonding method of the present invention according to the first aspect is formed by the constitution comprising from these bonding head 4 to the piezoelectric transducer 8. F denotes a load applied from the upper side of the bonding head 4 to the bonding face, and 9 denotes a base working as a working bench. The load F can be applied from the base 9 side and from both upper and lower sides.

Upon the execution of the bonding method of the present invention according to the first aspect, first, the package substrate 2 is fixed on the base 9, and the sealing cap 1 is positioned and placed on the bonding face formed on the package substrate 2. Further, the bonding head 4 is placed on the upper face 1b of the sealing cap 1, and while the load F of 3 to 5 kg per 1 mm$^2$ is applied, the sealing metal 3 is melted down so that the bonding between the bonding face 1a of the cap 1 and the upper face 2a of the package substrate 2 is achieved by impartment of the ultrasonic coupling oscillation generated in the bonding head 4 via the hones 5, 6 by the piezoelectric transducers 7, 8 driven for several hundred ms.

In the present invention, although the ultrasonic coupling oscillation of the example described above is generated by the synthesis of two oscillations transmitted of the longitudinal direction via the hones 5, 6 from directions orthogonal to each other on the bonding head 4 as an oscillation transmitting body acted as a bonding tool, this coupling oscillation can be made through another method. Regardless of any methods to be used, by making the ultrasonic coupling oscillation act on the bonding face 1a side, an excellent bonding condition can be achieved without thermal shock compared with conventional bonding methods.

In the bonding method of the present invention according to the first aspect, although ultrasonic oscillation is utilized, since coupling oscillation is imparted so that a bonding oscillation locus of the bonding head 4 does not become linear but two dimensional such as circular or elliptical, a remarkably excellent bonding condition can be realized.

In addition, in case of bonding in which a conventional single mode ultrasonic oscillation is utilized, since the oscillation locus imparted to the bonding head 4 is linear (one dimensional), a result that there is a directionality in the bonding may occur, whereby the result is likely to generate many cases in which the bonding in a direction perpendicular to the oscillating direction are not sufficiently executed. For this type of prior art, in the bonding method of the present invention, since the coupling oscillation is imparted so that the oscillation locus of the bonding head 4 does not become linear but two dimensional such as circular or elliptical, a directionality in bonding is not generated, and a remarkably excellent bonding condition can be realized.

In the bonding method of the present invention according to the first aspect, as a technique to make the oscillation of the bonding head 4 various two dimensional manners, for example, the frequency and the phase difference of the driving oscillation system of the hones 5, 6 and the piezoelectric transducers 7, 8 are changed. Particularly, in a case in which the piezoelectric transducer 7, 8 are driven by the same frequency, if the phases are the same, a straight line is drawn in its Lissajous' figures, and the oscillation locus can be changed variously, for example into circular by making the phases different by 90 degrees and into elliptical or other shapes by further different phase differences.

Further, in the bonding method of the present invention, as shown in FIG. 2, it is possible to take a manner in which a plurality of sealing caps 1 and a package substrates 2 are simultaneously bonded. Moreover, as shown in FIG. 3, it is possible to take a manner in which sealing is executed one after another by feeding in succession the package substrate 2 and the sealing cap 1 to a disklike ultrasonic welding chip 41 generating ultrasonic coupling oscillation while positioning them on the circumference of a rotating disk 91 and the package substrate 2 and the sealing cap 1 are fed out. In FIG. 3, an X direction ultrasonic oscillation on the circumference of the disklike chip 41 is generated by a piezoelectric transducer 71, and an ultrasonic oscillation of a Y direction is generated by a piezoelectric transducer 81 and a hone 61 for a torsional oscillation. Like reference numerals indicate like members and like portions throughout FIGS. 1, 2, and 3.

FIG. 4 shows an example in which the bonding method of the present invention according to the second aspect is applied to the bonding between a semiconductor chip 11 such as a flip chip and a substrate 12. 13 denotes a plurality of bumps (here, Au bumps) formed in advance in a bonding face 11a side of the flip chip 11, 14 denotes a welding chip vertically disposed in an upper face 11b side of the chip 11, and 15 and 16 denote oscillation transmitting hones coupled with the welding chip 14 in the direction orthogonal to the welding chip 14 with a place angle of about 90 degrees mutually. Piezoelectric transducers 17 and 18, for example, of a Langevin type are coupled with these hones 15 and 16, respectively. 19 denotes a base disposed under the substrate 12. By the constitution from the welding chip 14 to the base 19, formed is one example of an ultrasonic bonding device in which the bonding method of the present invention according to the second aspect is applied to the mounting of an IC chip to a substrate. F denotes a load applied, here, from the right above of the welding chip 41 in order to put the load to the bonding face.

In the bonding by means of the method of the present invention according to the second aspect exemplified in FIG. 4, first, a necessary number of Au bumps 13 are formed in the bonding face 11a side of the semiconductor chip 11. The formation of the Au bumps 13 are executed, for example, by a method employing a wire bonding technique. The size of the Au bump 13 can be from about 10 μm to about 100 μm. In the present invention, this chip 11 is mounted on the substrate 12 while employing the above described ultrasonic bonding device as a bonding tool. In an example executed, an excellent between-metal-bonding is obtained by imparting ultrasonic coupling oscillation for several hundred μs (seconds) to several ten ms (seconds) while about 50 g to 80 g of load F is applied per one bump.

In the bonding method of the present invention according to the second aspect, as shown in FIG. 5, a plurality of semiconductor chips 11 and substrates 12 can be bonded simultaneously. Further, as shown in FIG. 6, it is possible that a number of semiconductor chips 11 and substrates 12 are respectively positioned, are fed one after another to a bonding process according to the present invention, are fed between the ultrasonic welding chip 41 formed so as to generate coupling ultrasonic oscillation on the circumference of the rotated disk body and the rotated disklike base 91, are welded one after another, and are fedout. In FIG. 6, an ultrasonic oscillation on the circumference of the disk body is generated by a piezoelectric transducer 17, and an ultrasonic oscillation is generated by a piezoelectric transducer 18 for a torsional oscillation. Further, in FIG. 6, 91a denotes a shaft of the rotating base 91.

In a conventional bonding of the semiconductor chip 11 to the substrate 12 in which ultrasonic single phase oscillation is utilized, since the locus of the oscillation imparted to the welded chip 14 is linear (one dimensional), a directionality in bonding is generated. Thus, there are many cases generated in which the degree of bonding in a direction orthogonal to the oscillating direction is not sufficient.

In contrast with the conventional technique described above, in the bonding method of the present invention according to the second aspect, since ultrasonic coupling oscillation is imparted in the bonding face, the oscillation locus of the welded chip does not become linear. That is, by the method of the present invention, since coupling oscillation is imparted so that the locus becomes the two dimensional such as circular or elliptical on the bonding face, a remarkably excellent bonding condition can be realized.

As a technique by which the oscillation locus of a welded chip 4 is made various two dimensional manners, for example, the frequency and the phase difference of the driving oscillation system of the hones 15 and 16 and the piezoelectric transducers 17 and 18 are changed. Particularly, in a case in which the piezoelectric transducers 17 and 18 are driven by the same frequency, if the phases are the same, a straight line is drawn in its Lissajous' figures, and the oscillation locus can be changed variously into circular by making the phases different by 90 degrees and into elliptical or other shapes by making further different phase differences.

The present invention bonding method is as it is described in the above. That is, a bonding face of a sealing metal cap is positioned on a bonded face of a package substrate, and ultrasonic oscillations of different directions in the bonding plane are imparted at the same time while a suitable load is applied to the plane from an upper part of the bonding portion in a vertical direction so that the sealing metal cap and the package substrate are welded and fixed to be sealed on the bonding face. Accordingly, it became possible to execute bonding without impartment of thermal shock to a bonding object of even micro parts for which bonding without impartment of thermal shock was not possible in the past. Further, even in a case of bonding by ultrasonic oscillation, since coupling oscillation by which a directionality is not generated in bonding is utilized, a uniform, large area of bonding portion can be obtained. Particularly, about a half or less of amplitude of the ultrasonic oscillation required for bonding in the conventional device is required in the ultrasonic coupling oscillation employed in the bonding method of the present invention, and moreover, a half or less of time required for welding is also enough in the bonding method of the present invention due to the coupling oscillation, thereby giving remarkable effects that may not be obtained in conventional ultrasonic bonding techniques.

With the method of the present invention, when a semiconductor chip, specifically, a flip chip or the like, is mounted on a substrate, in order to obtain a mounting method by which an excellent bonding condition can be realized, the position of a bump of the semiconductor such as the flip chip is positioned on a bonded portion of the substrate, and while a suitable load is applied on the face to be bonded, coupling ultrasonic oscillation is imparted in the bonding face so that the semiconductor chip such as the flip chip and the substrate are melted and fixed. Accordingly, remarkable effects may be obtained that there is no directionality in the bonding condition, about a half or less of the amplitude required for bonding is sufficient compared with an ultrasonic imparting device in which a conventional linear oscillation locus is employed, and further, a half or less of time required for welding becomes sufficient.

What is claimed is:

1. A bonding method of electronic parts employing ultrasonic coupling oscillation, wherein a bonding face of a sealing metal cap for a surface mounting type quartz oscillator, a generator or a filter is positioned on a bonded face of a package substrate, and ultrasonic oscillations of different directions in the bonding plane are imparted at the same time while a suitable load is applied to the plane from an upper part or a lower part of the bonding portion in a vertical direction so that the sealing metal cap and the package substrate are welded and fixed to be scaled on the bonding face.

2. A bonding method according to claim 1, wherein the upper and lower positions of the sealing metal cap and the package substrate are reversed.

3. A bonding method according to claim 1, wherein the method in which ultrasonic oscillations of different directions in the bonding plane are of imparting from a lower side, of imparting from an upper side, or of imparting from both upper and lower sides of the bonding face.

4. A bonding method according to claim 2, wherein the method in which ultrasonic oscillations of different directions in the bonding plane are of imparting from a lower side, of imparting from an upper side, or of imparting from both upper and lower sides of the bonding face.

5. A bonding method of electronic parts employing ultrasonic coupling oscillation, wherein a bonding portion that is for a substrate and is called a bump in a semiconductor chip is placed downwards and is positioned on a predetermined position of the substrate that is placed upwards to bond the bump, and then while being pressed by a suitable load from the upper of the semiconductor chip, a plurality of bumps in the semiconductor chip are welded and fixed on a predetermined position by impartment of ultrasonic coupling oscillation to the bumps of the semiconductor chip and between the electrodes of the substrate corresponding to the bumps wherein the ultrasonic coupling oscillation is of imparting simultaneous ultrasonic oscillation with two different phases from an upper side of the bump of the semiconductor chip, from a lower side of the substrate, or both upper and lower sides.

6. The method of claim 5, wherein mounting of the semiconductor to the substrate is executed at a normal temperature without imparting preheating.

7. A bonding method according to claim 5, wherein the upper and lower relationship of the semiconductor chip and the substrate is reversed.

* * * * *